(12) United States Patent
Iizuka et al.

(10) Patent No.: US 8,747,609 B2
(45) Date of Patent: Jun. 10, 2014

(54) PLASMA PROCESSING APPARATUS AND SHOWER HEAD

(75) Inventors: Hachishiro Iizuka, Yamanashi (JP); Jun Abe, Yamanashi (JP); Yuki Mochizuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 711 days.

(21) Appl. No.: 12/888,664

(22) Filed: Sep. 23, 2010

(65) Prior Publication Data

US 2011/0067815 A1    Mar. 24, 2011

Related U.S. Application Data

(60) Provisional application No. 61/252,212, filed on Oct. 16, 2009.

(30) Foreign Application Priority Data

Sep. 24, 2009   (JP) ................................. 2009-218726

(51) Int. Cl.
  *H01L 21/3065*   (2006.01)
  *C23F 1/00*   (2006.01)
  *C23C 16/00*   (2006.01)

(52) U.S. Cl.
  USPC .................. 156/345.34; 118/723 E; 118/715

(58) Field of Classification Search
  CPC ................................................ H01J 37/32834
  USPC ............. 156/345.33, 345.34, 345.42, 345.46, 156/345.49
  See application file for complete search history.

(56) References Cited

U.S. PATENT DOCUMENTS

| | | | |
|---|---|---|---|
| 5,449,977 A * | 9/1995 | Nakagawa et al. | 315/111.51 |
| 5,651,826 A * | 7/1997 | Takagi | 118/724 |
| 6,207,026 B1 * | 3/2001 | Crocker | 204/192.12 |
| 6,403,491 B1 * | 6/2002 | Liu et al. | 438/710 |
| 6,432,261 B2 * | 8/2002 | Watanabe et al. | 156/345.47 |
| 6,537,418 B1 * | 3/2003 | Muller et al. | 156/345.34 |
| 6,579,373 B2 * | 6/2003 | Moriyama | 118/724 |
| 6,592,709 B1 * | 7/2003 | Lubomirsky | 156/345.48 |
| 6,863,835 B1 * | 3/2005 | Carducci et al. | 216/63 |
| 6,899,527 B2 * | 5/2005 | Quon et al. | 417/49 |

(Continued)

FOREIGN PATENT DOCUMENTS

| | | |
|---|---|---|
| JP | 2003-86580 | 3/2003 |
| JP | 2003-514386 | 4/2003 |

(Continued)

*Primary Examiner* — Gordon R Baldwin
*Assistant Examiner* — Aiden Lee
(74) *Attorney, Agent, or Firm* — Pearne & Gordon LLP

(57) ABSTRACT

A plasma processing apparatus includes a shower head that is installed within a processing chamber for processing a substrate therein so as to face a mounting table for mounting the substrate thereon and supplies a gas toward the substrate in a shower pattern through a plurality of gas discharge holes provided in a facing surface of the shower head facing the mounting table; a plurality of gas exhaust holes formed through the shower head to be extended from the facing surface of the shower head to an opposite surface from the facing surface; a multiple number of rod-shaped magnet pillars standing upright in a gas exhaust space communicating with the gas exhaust holes on the side of the opposite surface; and a driving unit that varies a distance between the magnet pillars and the gas exhaust holes by moving at least a part of the magnet pillars.

8 Claims, 4 Drawing Sheets

(56) References Cited

U.S. PATENT DOCUMENTS

| | | | |
|---|---|---|---|
| 7,156,047 B2 * | 1/2007 | Kang et al. | 118/723 R |
| 7,972,469 B2 * | 7/2011 | Hanawa et al. | 156/345.46 |
| 2001/0006093 A1 * | 7/2001 | Tabuchi et al. | 156/345 |
| 2004/0129218 A1 * | 7/2004 | Takahashi et al. | 118/715 |
| 2005/0268850 A1 * | 12/2005 | Ma | 118/723 R |
| 2006/0081559 A1 * | 4/2006 | Miyata et al. | 216/67 |
| 2006/0169410 A1 * | 8/2006 | Maeda et al. | 156/345.28 |

FOREIGN PATENT DOCUMENTS

| | | |
|---|---|---|
| JP | 2004-335637 A | 11/2004 |
| JP | 2007-525021 A | 8/2007 |
| WO | 01-37311 | 5/2001 |
| WO | 2005/052998 A2 | 6/2005 |

* cited by examiner

PLASMA PROCESSING APPARATUS AND SHOWER HEAD

CROSS-REFERENCE TO RELATED APPLICATION

This application claims the benefit of Japanese Patent Application No. 2009-218726 filed on Sep. 24, 2009, and U.S. Provisional Application Ser. No. 61/252,212 filed on Oct. 16, 2009, the entire disclosures of which are incorporated herein by reference.

FIELD OF THE INVENTION

The present disclosure relates to a plasma processing apparatus and a shower head.

BACKGROUND OF THE INVENTION

In the field of manufacture of a semiconductor device or the like, a shower head for supplying a gas toward a substrate such as a semiconductor wafer in a shower pattern has been conventionally used. To be specific, in a plasma processing apparatus that performs a plasma etching process on a substrate such as a semiconductor wafer, a mounting table for mounting the substrate thereon is installed in a processing chamber, and the shower head is installed so as to face the mounting table. The shower head is provided with a multiple number of gas discharge holes on its surface facing the mounting table, and a gas is supplied toward the substrate through the gas discharge holes in a shower pattern.

In such a plasma processing apparatus, there is known a technology for controlling plasma in a processing space by forming a magnetic field in the processing space by magnets installed around the processing chamber (see, for example, Patent Document 1). Further, there is also known a technology for confining plasma in a processing space by forming a magnetic field in a gas exhaust region of a processing chamber by magnets so as to allow a gas to pass the gas exhaust region and prevent plasma from passing the gas exhaust region (see, for example, Patent Document 2).

Patent Document 1: Japanese Patent Laid-open Publication No. 2003-86580
Patent Document 2: Published Japanese Translation of PCT Patent Application No. 2003-514386

As stated above, in the conventional plasma processing apparatus, plasma is controlled or confined by the magnetic field formed in the processing space. In such a plasma processing apparatus, however, processing rate at a center and a periphery of a substrate such as a semiconductor wafer may become different, resulting in deterioration of uniformity of a plasma process in the substrate surface.

BRIEF SUMMARY OF THE INVENTION

In view of the foregoing, the present disclosure provides a plasma processing apparatus and a shower head capable of improving uniformity of a plasma process in the substrate surface by controlling plasma density distribution in a processing space.

In accordance with one aspect of the present disclosure, there is provided a plasma processing apparatus including: a shower head that is installed within a processing chamber for processing a substrate therein so as to face a mounting table for mounting the substrate thereon and supplies a gas toward the substrate in a shower pattern through a plurality of gas discharge holes provided in a facing surface of the shower head facing the mounting table; a plurality of gas exhaust holes formed through the shower head to be extended from the facing surface of the shower head to an opposite surface from the facing surface; a multiple number of rod-shaped magnet pillars standing upright in a gas exhaust space communicating with the gas exhaust holes on the side of the opposite surface; and a driving unit that varies a distance between the magnet pillars and the gas exhaust holes by moving at least a part of the magnet pillars.

In accordance with another aspect of the present disclosure, there is provided a shower head that is installed in a processing chamber for processing a substrate therein so as to face a mounting table for mounting the substrate thereon and supplies a gas toward the substrate in a shower pattern through a plurality of gas discharge holes provided in a facing surface of the shower head facing the mounting table. The shower head includes a plurality of gas exhaust holes formed through the shower head to be extended from the facing surface to an opposite surface from the facing surface; and a multiple number of rod-shaped magnet pillars standing upright on the side of the opposite surface.

In accordance with the present disclosure, it is possible to provide a plasma processing apparatus and a shower head capable of improving uniformity of a plasma process in the substrate surface by controlling plasma density distribution in a processing space.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described in detail with reference to the accompanying drawings.

Figure 1:
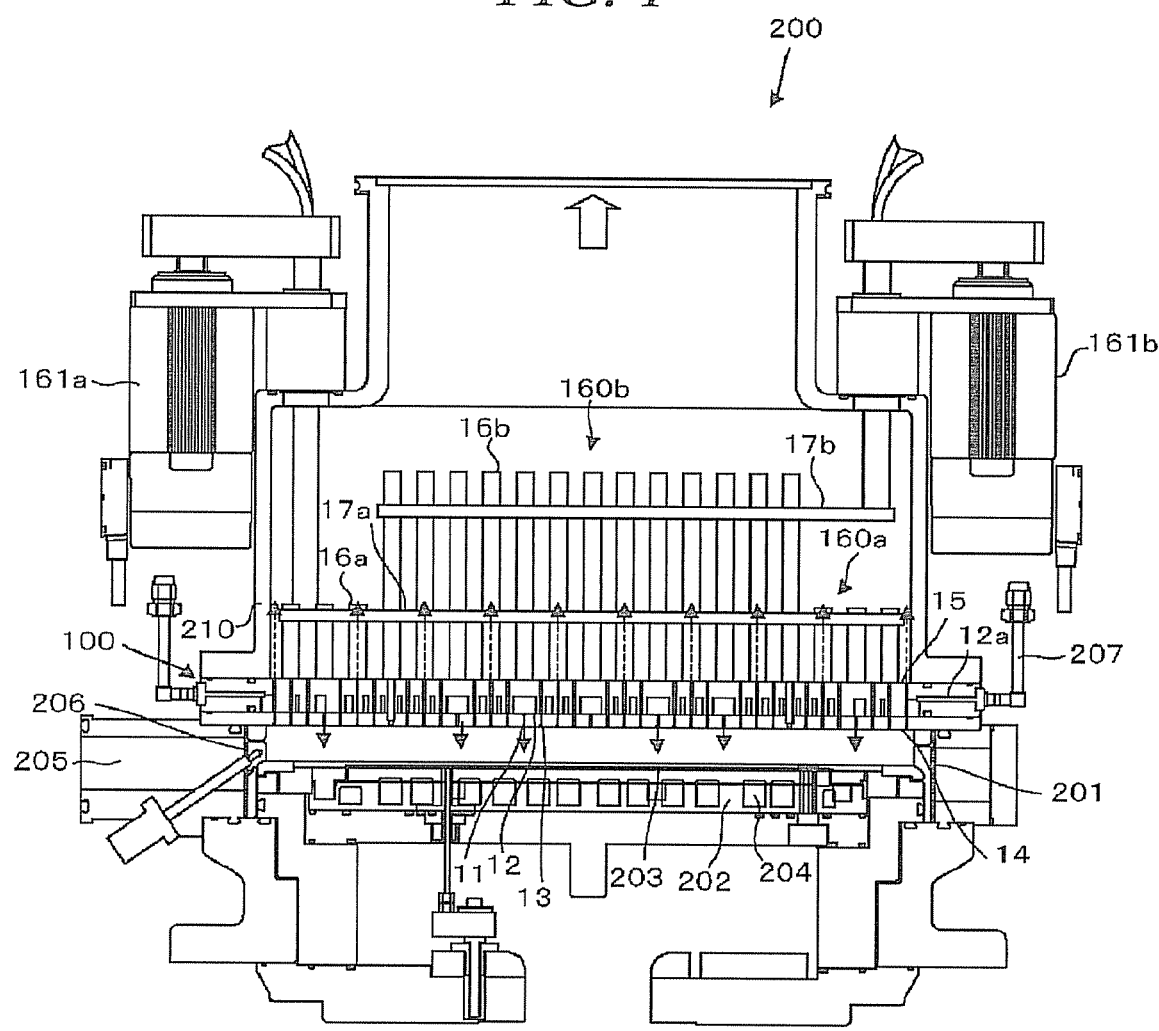
FIG. 1 is a longitudinal cross sectional view illustrating a configuration of a plasma processing apparatus in accordance with an embodiment of the present disclosure.
Figure 2:
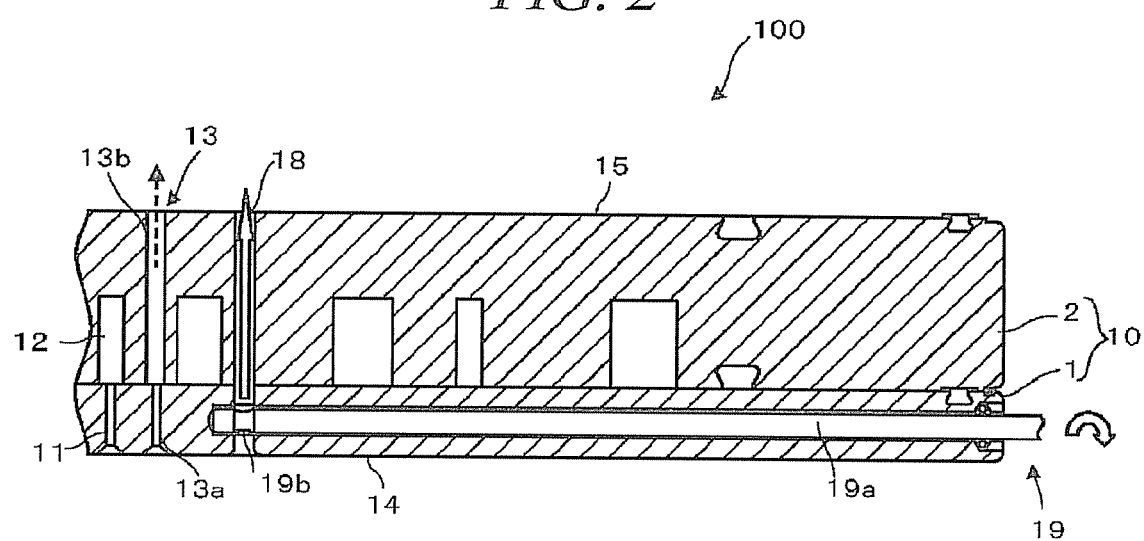
FIG. 2 is a longitudinal cross sectional view illustrating a configuration of major parts of a shower head in accordance with the embodiment of the present disclosure.
Figure 3:
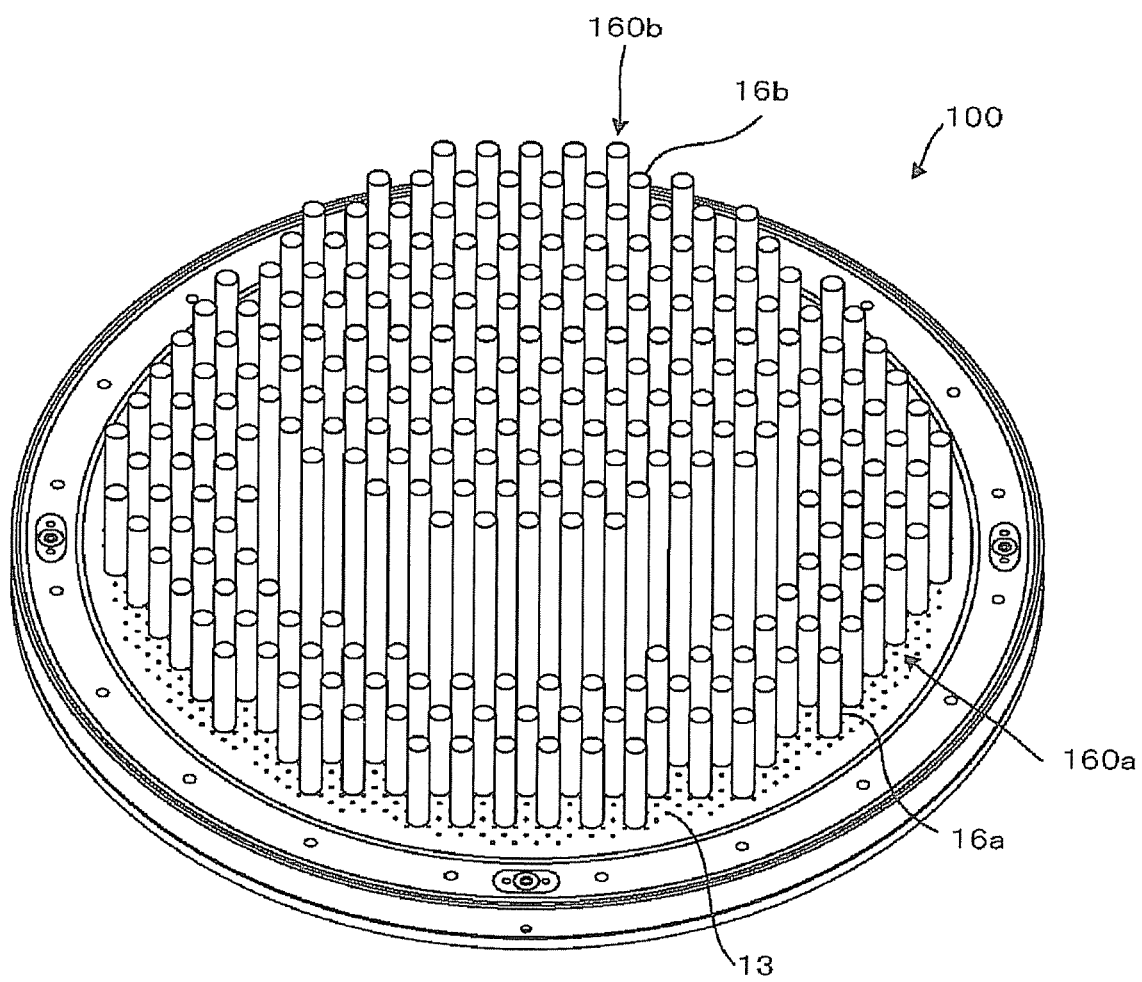
FIG. 3 is a perspective view of the shower head in accordance with the embodiment of the present disclosure.
Figure 4:
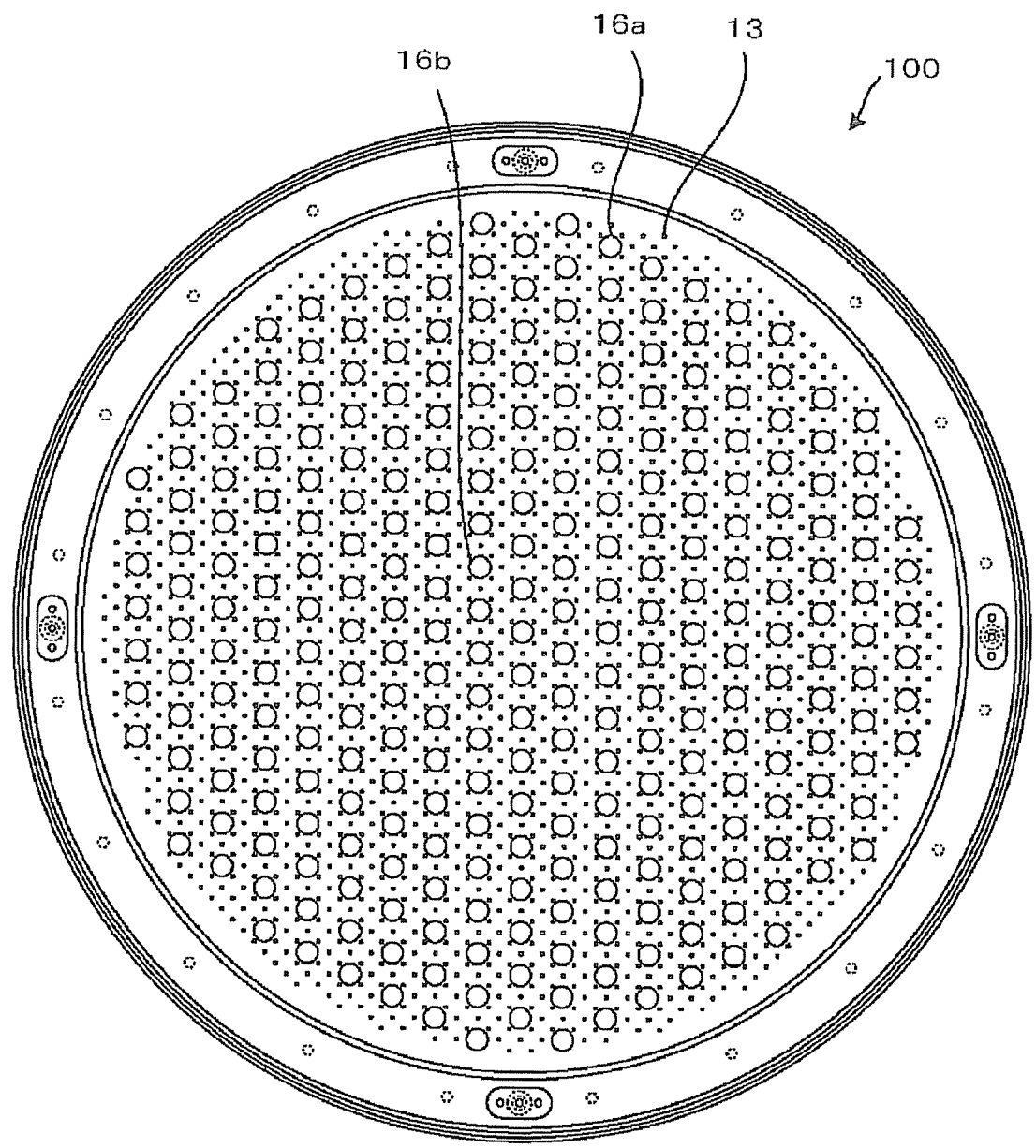
FIG. 4 is a top view of the shower head in accordance with the embodiment of the present disclosure.

FIG. 1 illustrates a cross sectional configuration of major parts of a plasma etching apparatus 200 as a plasma processing apparatus in accordance with an embodiment of the present disclosure. FIG. 2 is a cross sectional view illustrating a configuration of major parts of a shower head 100 installed in the plasma etching apparatus 200. FIG. 3 sets forth a perspective view showing a configuration of the shower head 100. FIG. 4 is a top view of the shower head 100.

As illustrated in FIG. 2, the shower head 100 is made up of a layered body 10 having two sheets of plate-shaped members: a lower member 1 and an upper member 2 placed on the top of the lower member 1. By way of example, the lower member 1 and the upper member 2 are made of aluminum of which surface is anodically oxidized. As shown in FIG. 1, the shower head 100 is installed in a processing chamber 201 of the plasma etching apparatus 200 so as to face a mounting table 202 that mounts a semiconductor wafer (substrate) thereon. That is, the lower member 1 shown in FIG. 2 is installed to serve as a surface 14 facing the mounting table 202 shown in FIG. 1.

In the layered body 10, the lower member 1 having the surface 14 facing the mounting table 202 is provided with a multiple number of gas discharge holes 11 (only one of them is shown in FIG. 2), and a gas flow path 12 communicating with the gas discharge holes 11 is formed between the lower member 1 and the upper member 2. The gas discharge holes 11 are configured to supply a gas toward the substrate (lower side of FIG. 1) in a shower pattern, as indicated by arrows in FIG. 1. Further, a gas inlet 12a through which the gas is introduced into the gas flow path 12 is provided in a peripheral portion of the layered body 10.

Further, a multiplicity of gas exhaust holes 13 (only one is shown in FIG. 2) are formed through the layered body 10, i.e., through the lower member 1 and the upper member 2. The gas exhaust holes 13 serve as a gas exhaust mechanism that performs evacuation so as to allow the gas to flow from a substrate side (lower side of the drawing) toward an opposite side from the substrate (upper side of the drawing), as indicated by dotted-line arrows in FIGS. 1 and 2. Each gas exhaust hole 13 has a small diameter part 13a, which is formed in the lower member 1, having a diameter of, e.g., about 0.5 mm to about 1.5 mm and a large diameter part 13b, which is formed in the upper member 2, having a diameter of, e.g., about 2.0 mm to about 5.0 mm.

The gas exhaust holes 13 are uniformly distributed over the entire region of the shower head 100 except its peripheral portion (configured as a fixing part to be fixed to the processing chamber 201), as illustrated in FIG. 4. For example, in case that the shower head 100 is designed to process a semiconductor wafer having a diameter of about 12 inches (about 300 mm), the number of the gas exhaust holes 13 may be about 2000 to about 2500. Further, in the present embodiment, the shower head 100 has an appearance of a circular plate shape conforming to the shape of the semiconductor wafer to be processed, as shown in FIG. 4.

Further, as can be seen from FIG. 1, a plurality of rod-shaped magnet pillars 16a and 16b are standing upright on the side of the upper member 2 of the layered body 10, i.e., on an opposite surface (rear surface) 15 from the surface 14 facing the mounting table 202.

The magnet pillars 16a and 16b are divided into two different magnet pillar sets: a first magnet pillar set 160a including short magnet pillars 16a installed on the peripheral portion of the shower head 100 and a second magnet pillar set 160b including long magnet pillars 16b installed at the central portion of the shower head 100.

The short magnet pillars 16a of the first magnet pillar set 160a are coupled by a coupling member 17a and are connected with a driving mechanism 161a shown on the left side of FIG. 1. The short magnet pillars 16a are vertically movable by the driving mechanism 161a independently of the second magnet pillar set 160b. Meanwhile, the long magnet pillars 16b of the second magnet pillar set 160b are coupled by a coupling member 17b and are connected with a driving mechanism 161b shown on the right side of FIG. 1. The long magnet pillars 16b are vertically movable by the driving mechanism 161b independently of the first magnet pillar set 160a.

The magnet pillars 16a and 16b are uniformly distributed over the entire region of the shower head 100 except its periphery (which will function as a fixing part fixed to the processing chamber 201), as illustrated in FIG. 3, for example. In FIG. 3, illustration of the coupling member 17a connecting the magnet pillars 16a and the coupling member 17b connecting the magnet pillars 16b is omitted.

For example, each of the magnet pillars 16a and 16b may be fabricated by sealing up a permanent magnet in a cylindrical member made of a metal such as aluminum or by sealing up a permanent magnet in a cylindrical member made of a non-metal material such as quartz. Further, the sealed magnet may be, e.g., magnetic ceramic or a magnetic liquid such as magnetic fluid. For the shower head 100 designed to process the semiconductor wafer having a diameter of, e.g., about 12 inches (about 300 mm), the number of the magnet pillars 16a and 16b may be more than several tens and less than about 300, desirably.

By the vertical movements of the first magnet pillar set 160a and the second magnet pillar set 160b, the distance between the gas exhaust holes 13 of the shower head 100 and the first and second magnet pillar sets 160a and 160b can be adjusted. With this mechanism, it is possible to adjust plasma leakage from a processing space between the shower head 100 and the mounting table 202 within the processing chamber 201 into a gas exhaust space on the side of the rear surface 15 of the shower head 100.

That is, for example, if the first magnet pillar set 160a and the second magnet pillar set 160b are positioned close to the gas exhaust holes 13 by moving them to a lower side of FIG. 1, plasma leakage from the gas exhaust holes 13 is suppressed. On the contrary, if the first magnet pillar set 160a and the second magnet pillar set 160b are distanced apart from the gas exhaust holes 13 by moving them to an upper side of FIG. 1, plasma leakage from the gas exhaust holes 13 is allowed. Furthermore, as the distance between the first and second magnet pillar sets 160a and 160b and the gas exhaust holes 13 increases, a plasma leakage region is expanded, and, thus, a plasma state can be controlled.

Moreover, for example, if the first magnet pillar set 160a is distanced apart from the gas exhaust holes 13 by moving it to the upper side of FIG. 1 and if the second magnet pillar set 160b is positioned close to the gas exhaust holes 13 by moving it to the lower side of FIG. 1, plasma leakage at the central portion of the shower head 100 is suppressed whereas plasma leakage at the peripheral portion of the shower head 100 is allowed. Accordingly, a plasma state such as plasma density can be locally controlled at the central portion and the peripheral portion of the shower head 100 independently.

If the plasma leakage toward the rear surface 15 of the shower head 100 increases excessively, however, plasma processing rate is decreased. For the reason, plasma leakage at the central portion of the shower head 100 may be always suppressed, whereas a plasma leakage state at the peripheral portion of the shower head 100 may be varied. In such a case, the driving mechanism 161b for the second magnet pillar set 160b may not be installed and the second magnet pillar set 160b may be fixed to the shower head 100. In this case, only the first magnet pillar set 160a may be configured to be vertically movable by the driving mechanism 161a, and the plasma leakage may be adjusted only at the peripheral portion of the shower head 100.

In the present embodiment, as shown in FIG. 2, an openable/closable trigger hole 18 is formed through the shower head 100 to be extended from the surface 14 facing the mounting table 202 to the opposite surface so as to allow plasma leakage from the facing surface 14 toward the rear surface 15. The trigger hole 18 has a diameter (e.g., about 2 mm) larger than that of the small diameter portion 13a of the gas exhaust holes 13 and can be opened and closed by an opening/closing mechanism such as a rotation valve 19. Further, the rotation valve 19 is configured to move a rotational shaft 19a through the trigger hole 13 from a lateral side. If the rotational shaft 19a is rotated to align the position of a through hole 19b formed in the rotational shaft 19a with the position of the trigger hole 18, the trigger hole 13 is opened, whereas if the rotational shaft 19a is rotated to allow the position of the through hole 19b to be deviated from the position of the trigger hole 18, the trigger hole 18 is closed.

As stated above, the diameter of the trigger hole 18 is larger than that of the small diameter portion 13a of the gas exhaust hole 13, and plasma may leak from the processing space toward a gas exhaust space through the trigger hole 18 more easily, as compared to when the plasma passes through the gas exhaust hole 13. Accordingly, in a state that the plasma does not leak from the processing space toward the gas exhaust space through the gas exhaust hole 13, the trigger hole 18 is opened, and, thus, plasma can be actively leaked. It may be desirable to provide a plurality of trigger holes 18 at the peripheral portion of the shower head 100. For example, plasma density in a peripheral portion of the processing space may be lower than plasma density in a central portion thereof. In such a case, if plasma is leaked in the peripheral portion and plasma is not leaked in the central portion, electrons or ions in the central portion of the processing space may move toward the peripheral portion thereof, thereby achieving uniform plasma density within the processing space.

If the plasma leaks toward the rear surface 15 of the shower head 100, however, the magnet pillars 16a and 16b may be exposed to the plasma and their temperature becomes high, resulting in deterioration of magnetic field quality. Thus, it may be desirable to provide a temperature control mechanism for cooling the magnet pillars 16a and 16b to maintain the magnetic field quality. In such a case, a temperature control mechanism that cools the magnet pillars by circulating a temperature control medium may be used, for example.

As shown in FIG. 1, the plasma etching apparatus 200 as the substrate processing apparatus having the above-described shower head 100 is configured as a plasma etching apparatus of a capacitively coupled parallel plate type in which upper and lower electrode plates are arranged in parallel to each other and are connected to power supplies (not shown) for plasma generation.

The plasma etching apparatus 200 includes a processing chamber (processing vessel) 201 formed in a cylindrical shape made of, e.g., aluminum of which surface is anodically oxidized. The processing chamber 201 is grounded. The mounting table 202 installed within the processing chamber 201 is configured to mount thereon the semiconductor wafer as a processing target substrate and the mounting table 202 serves as a lower electrode. The mounting table 202 is connected with a non-illustrated power supply for plasma generation.

An electrostatic chuck 203 that electrostatically attracts and holds the semiconductor wafer W thereon is provided on the mounting table 202. The electrostatic chuck 203 includes an electrode embedded in an insulator. The semiconductor wafer is electrostatically attracted and held by a Columbic force generated by a DC voltage applied to this electrode. Further, the mounting table 202 is provided with a flow path 204 through which a temperature control medium is circulated, and, thus, a temperature of the semiconductor wafer attracted to and held on the electrostatic chuck 203 can be regulated to a preset temperature. Furthermore, provided in a sidewall of the processing chamber 201 is an opening 205 through which the semiconductor wafer is loaded into or unloaded from the processing chamber 201, and an opening/closing mechanism 206 for airtightly closing the opening 205 is provided at the opening 205.

The shower head 100 is positioned above the mounting table 202 to face the mounting table 202 at a preset distance. The shower head 100 serving as the upper electrode and the mounting table 202 serving as the lower electrode form a pair of facing electrodes.

The gas inlet 12a of the shower head 100 is connected with a gas supply unit 207 of the processing chamber 201. A processing gas (etching gas) is supplied to the gas supply unit 207 from a non-illustrated gas supply mechanism.

Further, a cylindrical body 210 is provided above the shower head 100, and a vacuum pump (not shown) such as a turbo molecular pump is connected to the cylindrical body 210 via an opening/closing control valve, an opening/closing mechanism, and so forth. The inside of the cylindrical body 210 is configured as a gas exhaust path, and the magnet pillars 16a and 16b are provided in the gas exhaust path of the cylindrical body 210.

To perform plasma etching on the semiconductor wafer by the plasma etching apparatus 200, the semiconductor wafer is first loaded into the processing chamber 201 through the opening 205 and is mounted on the electrostatic chuck 203. Then, the semiconductor wafer is electrostatically attracted to and held on the electrostatic chuck 203. Subsequently, the opening 205 is closed, and the inside of the processing chamber 201 is evacuated to a preset vacuum level by the vacuum pump or the like.

Thereafter, a processing gas (etching gas) is supplied from the gas supply unit 207 into the gas inlet 12a of the shower head 100 at a certain flow rate. The processing gas is then supplied toward the semiconductor wafer on the mounting table 202 from the gas discharge holes 11 via the gas flow path 12 of the shower head 100 in a shower pattern.

Then, an internal pressure of the processing chamber 201 is maintained at a preset pressure, and then a high frequency power of a preset frequency such as about 13.56 MHz, is applied to the mounting table 202. As a result, a high frequency electric field is generated between the shower head 100 serving as the upper electrode and the mounting table 202 serving as the lower electrode, and the etching gas is dissociated and excited into plasma. Then, the etching process is performed on the semiconductor wafer by the plasma.

In the etching process, the processing gas supplied through the gas discharge holes 11 of the shower head 100 in a shower pattern is exhausted from the plurality of gas exhaust holes 13 distributed in the shower head 100. Accordingly, unlike in a case of exhausting the gas through a lower portion of the processing chamber 201, a gas does not flow from a central portion of the semiconductor wafer toward a peripheral portion thereof. Thus, the processing gas can be more uniformly supplied to the semiconductor wafer.

Furthermore, as described above, by adjusting the positions of the first and second magnet pillar sets 160a and 160b and by opening and closing the trigger hole 18, the plasma in the processing space of the processing chamber 201 can be made to leak into the gas exhaust space of the cylindrical body 210 and, thus, a plasma state in the processing space can be controlled. Accordingly, since plasma in the processing space can be generated uniformly, uniform etching can be performed on each area of the semiconductor wafer. That is, process uniformity in the wafer surface can be improved.

Such a plasma control may be performed by a control mechanism that controls the movements of the first and second magnet pillar sets 160a and 160b by the driving mechanisms 161a and 161b and the opening and closing of the trigger hole 18 by the rotation of the rotation valve 19, based on a measurement result obtained by a measurement unit that measures a plasma state within the processing chamber 201. The measurement unit may be, for example, a plasma monitor that detects the plasma state from a light emission state of plasma.

Upon the completion of the plasma etching process, the application of the high frequency power and the supply of the processing gas are stopped, and the semiconductor wafer is unloaded from the processing chamber 201 in the reverse order to that described above.

As discussed above, in the plasma etching apparatus 200 in accordance with the present embodiment, the plasma within the processing space can be generated uniformly, so that uniform etching process can be performed on each area of the semiconductor wafer.

Moreover, in the plasma etching apparatus 200 as described above, since the gas is exhausted through the gas exhaust holes 13 of the shower head 100, a gas exhaust path need not be provided in the vicinity of the mounting table 202 or the shower head 100, unlike in conventional, cases. Therefore, a diameter of the processing chamber 201 can be made similar to an outer diameter of the semiconductor wafer as a processing target substrate, so that the size of the apparatus can be reduced. Furthermore, since the vacuum pump is installed above the processing chamber 201 and the gas is exhausted from a region closer to the processing space of the processing chamber 201, gas exhaust can be carried out efficiently. Further, since a capacity of the vacuum pump can be reduced, the size of the apparatus can be further reduced.

Although the embodiments of the present disclosure have been described with reference to the accompanying drawings, the present disclosure is not limited to the above-stated embodiments but can be modified in various ways.

What is claimed is:

1. A plasma processing apparatus comprising:
   a shower head that is installed within a processing chamber for processing a substrate therein so as to face a mounting table for mounting the substrate thereon and supplies a gas toward the substrate in a shower pattern through a plurality of gas discharge holes provided in a facing surface of the shower head facing the mounting table;
   a plurality of gas exhaust holes formed through the shower head to extend from the facing surface of the shower head to an opposite surface from the facing surface;
   a multiple number of rod-shaped magnet pillars standing upright in a gas exhaust space communicating with the gas exhaust holes on the side of the opposite surface; and
   a driving unit that varies a distance between the magnet pillars and the gas exhaust holes by moving at least one of the magnet pillars in a direction perpendicular to the facing surface,
   wherein each magnet pillar overlaps with at least one of the plurality of gas exhaust holes when viewed from a ceiling of the processing chamber straight down,
   plasma leakage is controlled by adjusting a distance between the each magnet pillar and the at least one of the plurality of gas exhaust holes,
   the magnet pillars are divided into at least two different magnet pillar sets including a first magnet pillar set and a second magnet pillar set, and the first magnet pillar set and the second magnet pillar set are configured to be independently movable,
   the first magnet pillar set is installed at a peripheral portion of the shower head and the second magnet pillar set is installed at a central portion of the shower head, and
   a length of each magnet pillar included in the first magnet pillar set is shorter than a length of each magnet pillar included in the second magnet pillar set.

2. The plasma processing apparatus of claim 1, further comprising:
   at least one openable/closable trigger hole penetrated from the facing surface to the opposite surface to allow plasma leakage from the side of the facing surface toward the side of the opposite surface.

3. The plasma processing apparatus of claim 2, wherein the at least one openable/closable trigger hole is plural in number, and each trigger hole is configured to be opened and closed independently.

4. A shower head that is installed in a processing chamber for processing a substrate therein so as to face a mounting table for mounting the substrate thereon, and supplies a gas toward the substrate in a shower pattern through a plurality of gas discharge holes provided in a facing surface of the shower head facing the mounting table, the shower head comprising:
   a plurality of gas exhaust holes formed through the shower head to be extended from the facing surface to an opposite surface from the facing surface; and
   a multiple number of rod-shaped magnet pillars standing upright on the side of the opposite surface,
   wherein each magnet pillar is movable in a direction perpendicular to the facing surface,
   each magnet pillar overlaps with at least one of the plurality of gas exhaust holes when viewed from a ceiling of the processing chamber straight down,
   plasma leakage is controlled by adjusting a distance between the each magnet pillar and the at least one of the plurality of gas exhaust holes,
   the magnet pillars are divided into at least two different magnet pillar sets including a first magnet pillar set and a second magnet pillar set, and the first magnet pillar set and the second magnet pillar set are configured to be independently movable,
   the first magnet pillar set is installed at a peripheral portion of the shower head and the second magnet pillar set is installed at a central portion of the shower head, and
   a length of each magnet pillar included in the first magnet pillar set is shorter than a length of each magnet pillar included in the second magnet pillar set.

5. The shower head of claim 4, further comprising:
   at least one openable/closable trigger hole penetrated from the facing surface to the opposite surface to allow plasma leakage from the side of the facing surface toward the side of the opposite surface.

6. The shower head of claim 5, wherein the at least one openable/closable trigger hole is plural in number, and each trigger hole is configured to be opened and closed independently.

7. The plasma processing apparatus of claim 2, further comprising:
   a rotational shaft extending through the shower head and into the at least one trigger hole from a lateral side,
   wherein the rotational shaft includes a through hole that is rotatable within the at least one trigger hole.

8. The shower head of claim 5, further comprising:
   a rotational shaft extending through the shower head and into the at least one trigger hole from a lateral side,
   wherein the rotational shaft includes a through hole that is rotatable within the at least one trigger hole.

* * * * *